United States Patent [19]
Duvvury et al.

[11] Patent Number: 5,814,865
[45] Date of Patent: Sep. 29, 1998

[54] BIMODAL ESD PROTECTION FOR DRAM POWER SUPPLIES AND SCRS FOR DRAMS AND LOGIC CIRCUITS

[75] Inventors: Charvaka Duvvury, Plano; Michael D. Chaine, Missouri City, both of Tex.

[73] Assignee: Texas Instruments Incorporated, Dallas, Tex.

[21] Appl. No.: 742,196

[22] Filed: Oct. 31, 1996

[51] Int. Cl.[6] .................................................. H01L 23/62
[52] U.S. Cl. .......................... 257/360; 257/361; 257/362; 257/546
[58] Field of Search ..................................... 257/355–363, 257/173, 174, 546, 161, 162; 361/56, 91, 111, 118

[56] References Cited

U.S. PATENT DOCUMENTS

| | | | |
|---|---|---|---|
| 5,060,037 | 10/1991 | Rountree | 357/23.13 |
| 5,343,053 | 8/1994 | Avery | 257/362 |
| 5,572,394 | 11/1996 | Ker et al. | 361/156 |
| 5,602,404 | 2/1997 | Chen et al. | 257/356 |
| 5,623,156 | 4/1997 | Watt | 257/355 |

*Primary Examiner*—Sara W. Crane
*Attorney, Agent, or Firm*—Mark A. Valetti; W. James Brady; Richard L. Donaldson

[57] ABSTRACT

An embodiment of the instant invention is an ESD protection circuit (100) for protecting a circuit from negative stress, the ESD protection circuit comprising: a first terminal (102); a second terminal (104), the circuit to be protected connected between the first and the second terminals; a substrate (202) of a first conductivity type; a first doped region (206) of a second conductivity type opposite the first conductivity type and formed in the substrate, the first doped region forming the source of a transistor; a second doped region (208) of the second conductivity and formed in the substrate spaced from the first doped region by a channel region, the second doped region forming the drain of the transistor; a first diode region (210) of the first conductivity type and formed in the substrate, the first diode region being spaced a minimum distance from the second doped region and wherein the first diode region forms the anode of a diode (108) and the second doped region forms the cathode of the diode; and wherein the diode and the transistor (106) are connected between the first terminal and the second terminal, the diode protects the transistor and the circuit during the negative stress.

5 Claims, 2 Drawing Sheets

BIMODAL ESD PROTECTION FOR DRAM POWER SUPPLIES AND SCRS FOR DRAMS AND LOGIC CIRCUITS

FIELD OF THE INVENTION

The instant invention pertains to semiconductor devices and more specifically to the ESD protection devices for DRAM inputs and power supplies.

BACKGROUND OF THE INVENTION

In many circumstances where an electrostatic discharge event may occur, the backside of the substrate which bears a plurality of memory devices such as dynamic random access memories -Drams is typically not grounded. Due to this lack of grounding of the backside of the substrate, the typical method of using a grounded gate nMOS device is ineffective for protecting the memory circuitry. Typically, the grounded gate nMOS devices is utilized for clamping the ESD (electrostatic discharge)transients to a value below the gate oxide breakdown level. However, under these circumstances, this device is not effective for negative ESD events because the substrate is floating, which results in the gate and source of the MOSFET to go "high" together thereby causing the MOSFET to breakdown and fail.

Most DRAM circuits use, as mentioned above, large grounded gate nMOS devices which are connected between $V_{DD}$ and $V_{SS}$ so as to provide supply protection. Some DRAM circuits, on the other hand, use a diode as the protection device. Neither an nMOS device (for negative stress) nor a diode, alone (for positive stress), are very effective in protecting a device when ESD stress is applied to the positive power supply terminal. In addition, placing a diode and an nMOS device as two separate discrete protection devices is not optimal because the layout bus resistance makes the combination of the two devices ineffective for negative stress.

It is, therefore, an object of the instant invention to provide an integrated ESD protection device which protects a device or series of devices from negative ESD stress. Another object of the instant invention is to provide an integrated ESD protection device which protects a device or series of devices from negative ESD stress where the backside of the device is not grounded.

SUMMARY OF THE INVENTION

An embodiment of the instant invention is an ESD protection circuit for protecting a circuit from negative stress, the ESD protection circuit comprising: a first terminal; a second terminal, the circuit to be protected connected between the first and the second terminals; a substrate of a first conductivity type; a first doped region of a second conductivity type opposite the first conductivity type and formed in the substrate, the first doped region forming the source of a transistor; a second doped region of the second conductivity and formed in the substrate spaced from the first doped region by a channel region, the second doped region forming the drain of the transistor; a first diode region of the first conductivity type and formed in the substrate, the first diode region being spaced a minimum distance which is the minimum "design distance" that two implanted regions can be spaced apart using standard implantation processing from the second doped region and wherein the first diode region forms the anode of a diode and the second doped region forms the cathode of the diode; and wherein the diode and the transistor are connected between the first terminal and the second terminal, the diode protects the transistor and the circuit during the negative stress. Preferably, the first conductivity type is p-type, and the second conductivity type is n-type.

Another embodiment of the instant invention is an ESD protection circuit for protecting a circuit from negative stress, the ESD protection circuit comprising: a substrate of a first conductivity type and having a surface; a lightly doped region of a second conductivity type opposite the first conductivity type and situated in the substrate; a first doped region of the first conductivity type and situated at the surface of the substrate and in the lightly doped region, the first doped region forming the anode of a first diode and a second diode; a first source region of the second conductivity type and situated at the surface of the substrate and spaced away from the lightly doped region; a first drain region of the second conductivity type and situated at the surface of the substrate, spaced away from the first source region by a first channel region, and abutting the lightly doped region, the first drain region forming the cathode of the first diode; a first gate insulatively disposed over the first channel region, the first source region, first drain region and the first gate forming a first transistor; a second source region of the second conductivity type and situated at the surface of the substrate and spaced away from the lightly doped region; a second drain region of the second conductivity type and situated at the surface of the substrate, spaced away from the second source region by a second channel region, and abutting the lightly doped region, the second drain region forming the cathode of the second diode; a second gate insulatively disposed over the first channel region, the second source region, second drain region and the second gate forming a second transistor; and wherein the first source region, the first gate, the second source region, the second gate, and the first doped region are connected and the first and second drain regions are tied together, the first and second diodes protect the first and second transistors and the circuit to be protected during the negative stress.

Another embodiment of the instant invention is an ESD protection circuit for protecting a circuit from negative stress, the ESD protection circuit comprising: a first terminal; a second terminal, the circuit to be protected connected between the first and the second terminals; a substrate of a first conductivity type; a lightly doped region of a second conductivity type opposite the first conductivity type and formed in the substrate; a first doped region of the second conductivity type and formed in the substrate and within the lightly doped region; a second doped region of the first conductivity and formed in the substrate and within the lightly doped region, the second doped region abutting the first doped region such that the first and the second doped regions form the anode of an SCR; (silicon controlled rectifier) a first diode region of the first conductivity type and formed in the substrate, the first diode region being spaced a minimum distance from the first doped region and wherein the first diode region forms the anode of a diode and the first doped region forms the cathode of the diode; and wherein the diode and the SCR are connected between the first terminal and the second terminal, the diode protects the circuit during the negative stress. Preferably, a portion of the first diode region is situated in the lightly doped region. However, the first diode region may be formed entirely within the lightly doped region.

In an embodiment of the instant invention a reverse diode, between the pad in which the ESD event is introduced and ground, is integrated with an nMOS device so that for a positive ESD event, the drain avalanche of the nMOS device influences the reverse breakdown of the diode thereby adding to the overall protection by the diode and the nMOS device. For a negative ESD event, the forward conduction of the diode overtakes the nMOS device with its gate tied to ground and protects the nMOS device. This embodiment can also be utilized to improve the ability to protect devices in DRAM applications when a low-voltage SCR is used.

In summary, one embodiment of the instant invention is a reversed biased diode integrated with an MOS device wherein the anode of the diode is spaced a minimum distance from the drain of the nMOS device. Another embodiment of the instant invention is a reverse biased diode integrated with an SCR wherein the anode of the diode is spaced a minimum distance from the anode of the SCR.

DETAILED DESCRIPTION OF THE DRAWINGS

Figure 1:
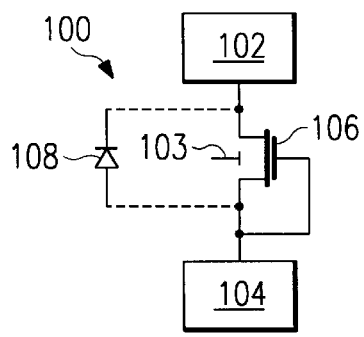
FIG. 1 is a block diagram of an ESD protection circuit.

FIG. 1 illustrates ESD protection circuit 100. ESD protection circuit 100 is comprised of terminals 102 and 104. The circuit which is to be protected by protection circuit 100, which is not illustrated in FIG. 1, is preferably connected between terminals 102 and 104. Terminals 102 and 104 are supply terminals. Preferably, $V_{DD}$ is applied to terminal 102 while $V_{SS}$ is applied to terminal 104. In a typical ESD event, a positive charge (in reference to ground) is introduced at supply pad 102 while supply pad 104 remains grounded. However, it is also likely that a negative charge or negative voltage (in reference to ground) may collect on supply pad 102 while supply pad 104 is in reference to ground. In the following description, the former event (positive charge on pad 102 in reference to ground) will be referred to as a "positive ESD event" while the latter event (negative charge collected on pad 102 in reference to ground) will be referred to as a "negative ESD event". (Note: A "negative" event on pad 102 is equivalent to a "positive" event on pad 104. This is due to the fact that substrate 103 is floating.) In a positive ESD event, ESD protection circuit 100 is sufficient to protect a circuit connect to ESD protection circuit 100 even if ESD protection circuit does not include reverse diode 108.

Figure 1A:
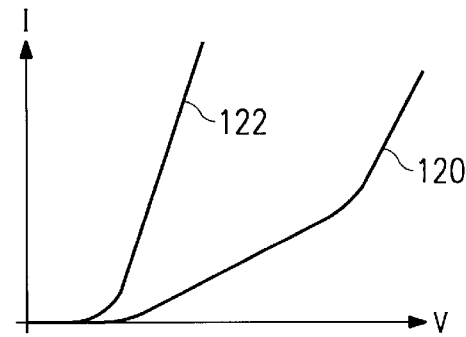
FIG. 1a is an I–V curve illustrating the ESD current versus voltage for the ESD protection device of FIG. 1.

However, during a negative ESD event, ESD protection circuit 100 would not provide sufficient ESD protection to circuitry connected to protection circuit 100 if diode 108 is not included in protection circuit 100. Plot 120 of FIG. 1a illustrates the I–V response of protection circuit 100 during a negative ESD event if diode 108 is not included in protection circuit 100. However, if diode 108 is included in protection circuit 108, circuitry connected to protection circuit 100 would be sufficiently protected. Plot 122 of FIG. 1a illustrates the I–V response of protection 100 which includes diode 108.

Figure 2:
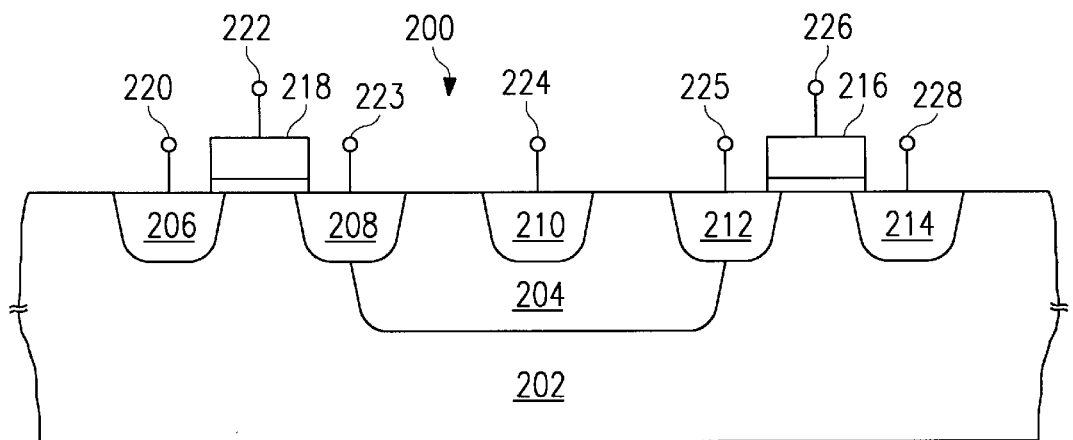
FIG. 2 is a cross-sectional view of an ESD protection device incorporating one embodiment of the instant invention.
Figure 2A:
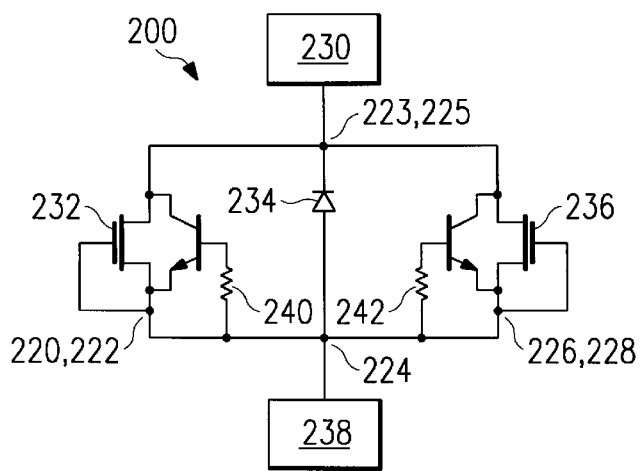
FIG. 2a is a schematic diagram illustrating the equivalent circuit of the ESD protection device of FIG. 2.
Figure 2B:
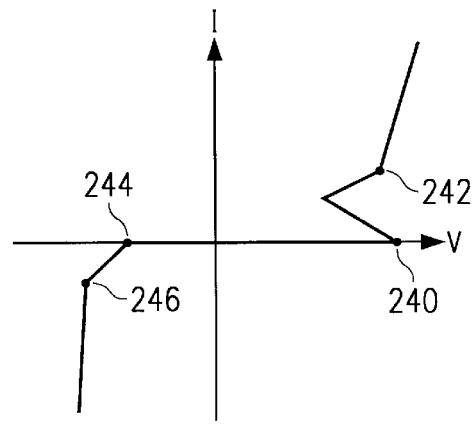
FIG. 2b is an I–V curve illustrating the ESD current versus voltage for the ESD protection device of FIG. 2.

FIGS. 2 and 2a illustrate ESD protection circuit 200 and its circuit equivalent, respectively. FIG. 2b illustrates the I–V characteristics of ESD protection circuit 200. Preferably, ESD protection circuit 200 includes two nMOS devices. The first nMOS device is defined by source/drain regions 206 and 208. Preferably, both of these regions are $n^+$ regions and source region 206 is connected to conductive gate structure 218 via contacts 220 and 222. In addition, contacts 220 and 222 are connected to ground. The second nMOS device is defined by source/drain regions 212 and 214 and conductive gate structure 216. As with the first nMOS device, source/drain regions 212 and 214 are preferably $n^+$ regions and conductive gate structure 216 is connected to source region 214 via contacts 226 and 228. In addition, contacts 226 and 228 are connected to ground. Lightly doped region 204 is situated between the two nMOS devices, and heavily doped region 210 is situated within region 204. Preferably, lightly doped region is an $n^-$ region 204 and heavily doped region 210 is a $p^+$ region. Due to the placement of regions 208, 210 and 212, a diode is formed by region 210 and 208 and another diode is formed by regions 210 and 212. Since these two diodes are in parallel, they, as a pair, will have a lower resistance. In addition, one transistor is formed such that its base is formed by the substrate (contacted by backside 229), its emitter is formed from region 206 and the collector is formed by region 208. Similarly, a second transistor is formed by the substrate (base), region 214 (emitter) and region 212 (collector). The circuit diagram for such a device is depicted in FIG. 2a.

FIG. 2a represents the circuit equivalent of ESD protection device 200 in FIG. 2 where specific connections are made. More specifically, the circuit of FIG. 2a illustrates the device of FIG. 2 where terminals 220, 222, 224, 226, and 228 are all connected to $V_{SS}$ (represented by block 238, and is preferably grounded) and terminals 223 and 225 are connected to $V_{DD}$ (represented in FIG. 2a as block 230). In addition, diode 234 represents the diodes formed between region 210 and 208 and regions 210 and 212. Resistors 240 and 242 represent the resistance between the substrate and ground.

FIG. 2b illustrates the I–V characteristics of protection device 200. During a positive ESD event, nMOS devices 232 and 236 become conductive at point 240. After, "snapback" and voltage build-up, the diodes (diode 234) go into reverse breakdown and thereby conduct current along with nMOS devices 232 and 236, at point 242. In other words, the nMOS breakdown into a bipolar device occurs before the breakdown of the diodes. Subsequently, the locally generated carriers also trigger the diodes (represented as diode 234) into breakdown and the ESD current is conducted by both the nMOS devices and the diodes.

In a negative ESD event, nMOS devices 232 and 236 become conductive at point 244, and both the nMOS devices and the diodes (diode 234) become conductive at point 246. More specifically, the nMOS devices will first turn on due to sub-threshold conduction and go into saturation. However, with only a small current draw, the diodes will turn on in forward bias mode and protect the nMOS devices from damage. Hence, the nMOS devices are important for positive ESD events because of the "snap-back" effect of these devices which protects the gate oxides of the circuits to be protected and because they trigger the diodes. However, the diodes are the primary protection devices during negative ESD events.

Figure 3:
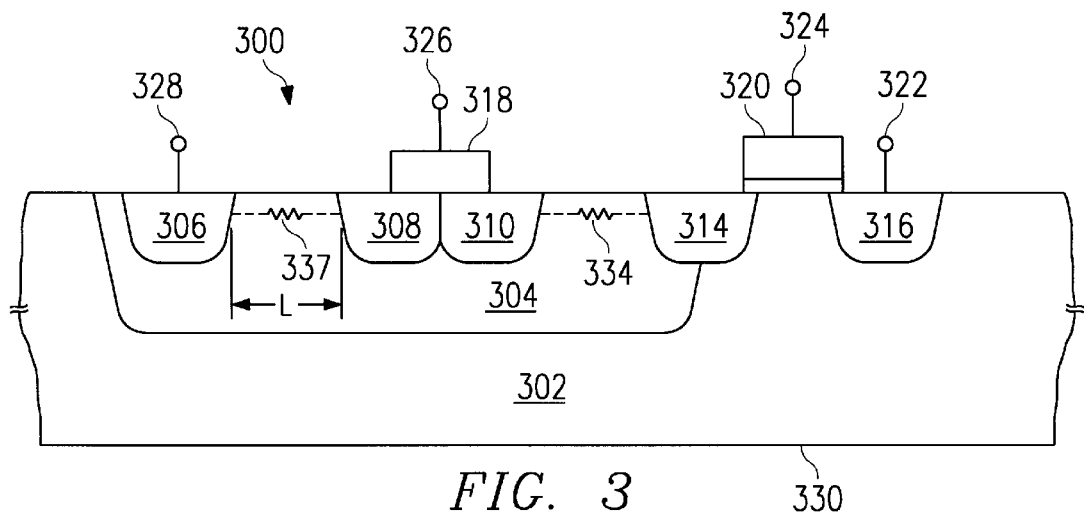
FIG. 3 is a cross-sectional view of an ESD protection device incorporating a second embodiment of the instant invention.
Figure 3A:
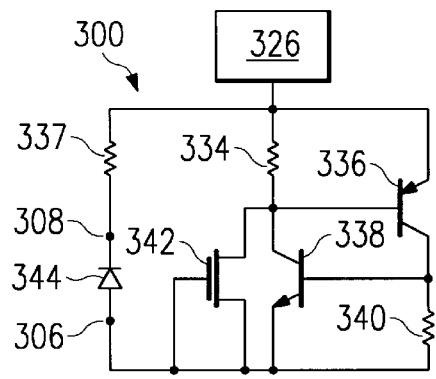
FIG. 3a is a schematic diagram illustrating the equivalent circuit of the ESD protection device of FIG. 3.

FIG. 3 illustrates low-voltage SCR (LVTSCR) 300 which is preferably used to protect DRAM circuitry from negative ESD event damage. FIG. 3a illustrates a circuit equivalent of low-voltage SCR 300. Referring to FIG. 3, LVTSCR 300 is comprised of an nMOS device which includes gate structure 320 and source/drain regions 314 and 316. Preferably source/drain regions are n+ regions and substrate 302 is of a p-type. Source region 316 is connected to gate structure 320 via terminals 322 and 324 and both are preferably connected to ground. Lightly doped region 304 abuts source/drain region 314 and is preferably a n− region. Region 310 may be placed within region 304 such that it abuts region 314 (this is done where these regions are not silicided) or it may be spaced away from region 314 (as is shown in FIG. 3). No matter whether region 310 abuts region 314 or not, region 310 and region 308 are formed such that they abut. Preferably, region 308 is a heavily doped n-type region (n+ region) and region 310 is a heavily doped p-type region (p+ region). Both region 308 and 310 are contacted to contact 318 which is connected to terminal 326. Terminal 326 is preferably connected to a supply or it may be an input/output terminal. Region 306 is formed within region 304 such that its distance, L, from region 308 is minimized. Region 306 is preferably a p+ region and is preferably connected to ground via terminal 328.

Terminal 326 provides the contact to the anode of the SCR of FIG. 3, and terminal 322 provides the contact to the cathode of the SCR of FIG. 3. In addition, terminal 326 provides the contact to the cathode of diode 344, while terminal 328 provides the contact to the anode of diode 344.

FIG. 3a is an equivalent circuit schematic of the integrated structure of FIG. 3. The pnp device 336 is formed from regions 310, 304, and 302 while resistor 340 represents the substrate resistance to ground. The npn device 338 is formed by regions 314, 302, and 316 while resistor 334 represents the resistance between regions 310 and 314. The series element of diode 344 and resistor 337 is formed by regions 306 and 308 (forming diode 344) and well region 304 (forming resistor 337).

Even without region 306, LVTSCR 300 forms an effective ESD protection device for grounded substrate integrated chips. For positive stress, the pnpn device, formed with regions 310, 304, 302, and 316 latches to provide adequate protection. For negative stress events where the substrate is grounded, the forward biased diode, formed by regions 304 and 302, provides adequate protection. However, for DRAMs with a floating substrate this diode for negative stress is not present. Therefore, the nMOS device formed by regions 314, 320, and 316 fails for similar reasons that device 100 of FIG. 1 failed. However, in the protection circuit 300, region 306 (preferably a p+ type region) provides lateral diode protection for negative stress. The lateral diode (diode 344) is formed by regions 306 and 308. In other words, lateral diode 344 protects nMOS device 342 (formed by regions 314 and 316 and gate 320) during negative stress. In view of this, protection circuit 300 can be used for DRAM input/output pin protection applications.

Figure 4A:
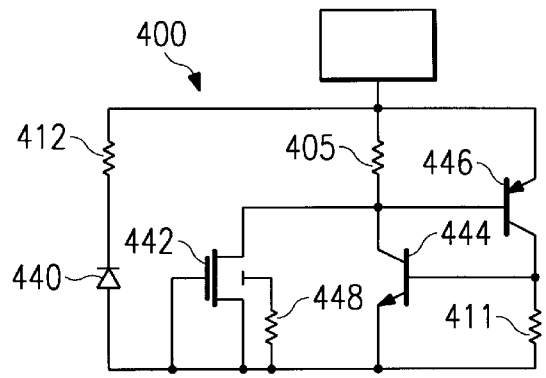
FIG. 4a is a schematic diagram illustrating the equivalent circuit of the ESD protection device of FIG. 4.
Figure 4:
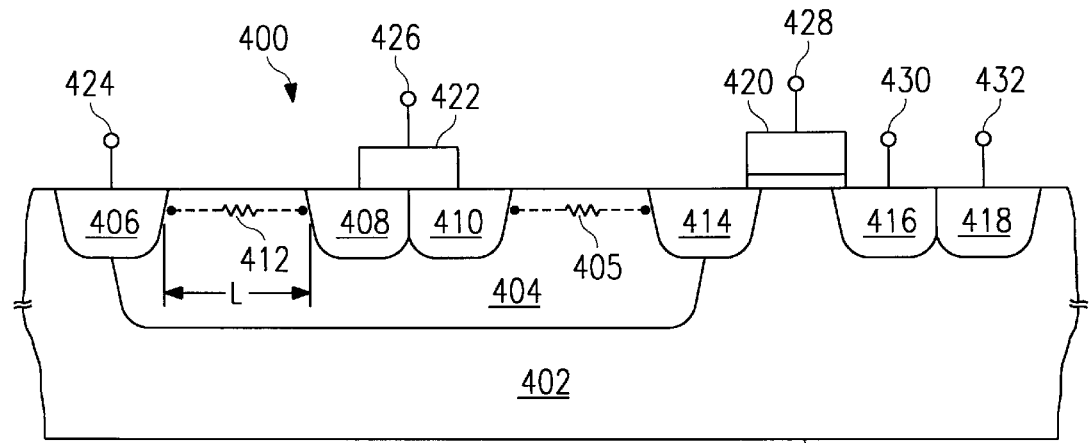
FIG. 4 is a cross-sectional view of an ESD protection device for grounded substrate technologies which incorporates a third embodiment of the instant invention.

FIG. 4 illustrates ESD protection device 400 which is operable in instances for grounded substrate chips and where a large ESD charge is applied to wafer backside 434. This type of situation may be introduced during a charge device model CDM) event. In such an event, terminals 424, 428, 430 and 432 are preferably connected to wafer backside 434 while terminal 426 is connected to ground.

ESD protection device 400 includes an nMOS device which is comprised of source/drain regions 414 and 416 (preferably n+ regions) and conductive gate structure 420. Region 418 abuts region 416 and provides a contact to substrate 402. Preferably, region 418 is a p+ region. Source/drain region 414 abuts lightly doped region 404, which is preferably an n− region formed in a p-type substrate. Heavily doped regions 408 and 410 abut each other and are spaced from source/drain region 414. Preferably region 408 is a n+ region and region 410 is a p+ region. Region 408 is preferably spaced a minimum distance, L, from region 406 (which is preferably a p+ region).

Region 406 abuts region 404 and is preferably placed a minimum distance, L, from region 408. When substrate 402 becomes positively charged and terminal 426 is grounded, diode 440, which is formed by regions 406 and 408, becomes forward biased and protects nMOS device 442, which is formed by regions 414 and 416 and gate 420. Although there is an inherent vertical diode present (formed by substrate 402 and n-well 404 and highly doped region 408), this is not effective to provide the appropriate protection due to the resistance of region 404. Instead, lateral diode 440 carries more of the CDM current flow to protect nMOS device 442 because diode 440 has a relatively lower resistance (denoted as resistor 412). LVTSCR 400 provides effective protection for grounded substrate chips for both CDM and the human body model (HBM).

Terminal 426 provides the contact to the anode of the SCR of FIG. 4, while terminal 430 provides the contact to the cathode of the SCR of FIG. 4. In addition, terminal 426 provides the contact to the cathode of diode 440, and terminal 424 provides the contact to the anode of diode 440.

FIG. 4a is an equivalent circuit schematic of the integrated structure of FIG. 4. The pnp device 446 is formed from regions 410, 404, and 402, while resistor 411 represents the substrate resistance. The npn device 444 is formed from regions 414, 402, and 416 and resistor 405 represents the resistance between regions 406 and 408. Resistor 448 also represents the substrate resistance.

In summary, protection device 100, which includes diode 108, provides effective power supply protection for DRAMs. Protection device 300 is an effective input/output protection device for DRAMs, and is operable in both HBM and CDM. Protection device 400 is an effective input/output protection device for logic circuitry with a grounded substrate. Protection device 400 is effective for both HBM and CDM.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. An ESD protection circuit for protecting a circuit, said ESD protection circuit comprising:
   a substrate of a first conductivity type and having a surface;
   a lightly doped region of a second conductivity type opposite said first conductivity type and situated in said substrate;
   a first doped region of said first conductivity type and situated at said surface of said substrate and in said lightly doped region, said first doped region forming the anode of a first diode and a second diode;

a first source region of said second conductivity type and situated at said surface of said substrate and spaced away from said lightly doped region;

a first drain region of said second conductivity type and situated at said surface of said substrate, spaced away from said first source region by a first channel region, and abutting said lightly doped region, said first drain region forming the cathode of said first diode;

a first gate insulatively disposed over said first channel region, said first source region, first drain region and said first gate forming a first transistor;

a second source region of said second conductivity type and situated at said surface of said substrate and spaced away from said lightly doped region;

a second drain region of said second conductivity type and situated at said surface of said substrate, spaced away from said second source region by a second channel region, and abutting said lightly doped region, said second drain region forming the cathode of said second diode;

a second gate insulatively disposed over said second channel region, said second source region, second drain region and said second gate forming a second transistor;

and wherein said first source region, said first gate, said second source region, said second gate, and said first doped region are electrically connected to each other and said first and second drain regions are electrically connected to each other.

2. An ESD protection circuit for protecting a circuit, said ESD protection circuit comprising:

a substrate of a first conductivity type and having a top surface and a bottom surface;

a lightly doped region of a second conductivity type different from said first conductivity type and situated in said substrate;

a first doped region of said second conductivity type, said first doped region formed in said substrate and abutting said lightly doped region;

a second doped region of said second conductivity type, said second doped region formed in said substrate and spaced away from said lightly doped region;

a channel region formed in said substrate between said first doped region and said second doped region;

a gate structure insulatively disposed over said channel region;

a third doped region of said first conductivity type and formed in said lightly doped region;

a fourth doped region of said second conductivity type and formed in said lightly doped region;

a fifth doped region of said first conductivity type and formed in said lightly doped region and abutting said fourth doped region, said fourth and fifth doped regions situated between said first and third doped regions;

a first terminal electrically connected to said fourth and fifth doped regions;

a second terminal electrically connected to said second doped region;

and wherein said circuit to be protected is connected between said first and second terminals.

3. The ESD protection circuit of claim 2, wherein said third doped region forms the anode of a first diode and said fourth doped region forms the cathode of said diode.

4. The ESD protection circuit of claim 2, wherein said second terminal is additionally electrically connected to said third doped region.

5. The ESD protection circuit of claim 4, wherein said second terminal is electrically connected to ground.

* * * * *